(12) United States Patent
Jiang et al.

(10) Patent No.: US 7,471,152 B2
(45) Date of Patent: Dec. 30, 2008

(54) AUTOMATIC GAIN CONTROL AND TUNED LOW NOISE AMPLIFIER FOR PROCESS-INDEPENDENT GAIN SYSTEMS

(75) Inventors: Lloyd Jian-Le Jiang, Laguna Niguel, CA (US); Rabih Makarem, Irvine, CA (US); Kwai-Kwong K. Lam, Rancho Santa Marganta, CA (US); Christopher R. Leon, Irvine, CA (US)

(73) Assignee: Atheros Technology Ltd., Santa Clara, CA (US)

( * ) Notice: Subject to any disclaimer, the term of this patent is extended or adjusted under 35 U.S.C. 154(b) by 128 days.

(21) Appl. No.: 11/273,376

(22) Filed: Nov. 14, 2005

(65) Prior Publication Data

US 2006/0103465 A1 May 18, 2006

Related U.S. Application Data

(60) Provisional application No. 60/627,595, filed on Nov. 12, 2004.

(51) Int. Cl.
*H03F 3/04* (2006.01)
(52) U.S. Cl. .................................. 330/289; 327/539
(58) Field of Classification Search ................. 330/289; 327/539; 323/316; 455/333
See application file for complete search history.

(56) References Cited

U.S. PATENT DOCUMENTS

| | | | |
|---|---|---|---|
| 5,504,684 A | 4/1996 | Lau et al. | |
| 5,646,518 A * | 7/1997 | Lakshmikumar et al. | 323/316 |
| 5,767,732 A | 6/1998 | Lee et al. | |
| 6,075,407 A * | 6/2000 | Doyle | 327/539 |
| 6,281,743 B1 * | 8/2001 | Doyle | 327/539 |
| 6,526,322 B1 | 2/2003 | Peng et al. | |
| 6,724,176 B1 * | 4/2004 | Wong et al. | 323/316 |
| 6,853,238 B1 * | 2/2005 | Dempsey et al. | 327/539 |
| 7,039,384 B2 * | 5/2006 | Pan | 455/333 |
| 7,071,767 B2 * | 7/2006 | Ou-yang et al. | 327/539 |
| 7,078,958 B2 * | 7/2006 | Gower et al. | 327/539 |
| 7,199,646 B1 * | 4/2007 | Zupcau et al. | 327/539 |
| 7,236,048 B1 * | 6/2007 | Holloway et al. | 327/539 |
| 2001/0015653 A1 | 8/2001 | De Jong et al. | |
| 2005/0003767 A1 * | 1/2005 | Song | 455/75 |

* cited by examiner

*Primary Examiner*—Robert Pascal
*Assistant Examiner*—Hieu P Nguyen
(74) *Attorney, Agent, or Firm*—Gates & Cooper LLP

(57) ABSTRACT

A tuned low-noise amplifier is disclosed. A device in accordance with the present invention comprises a first current source, a second current source, a comparator, coupled to the first current source and the second current source, for providing a control signal, and a third current source, receiving the control signal and coupled to the tuned low-noise amplifier, wherein a current in the third current source is proportional to a current in the first current source and the second current source, where values of the first current source, the second current source, and the third current source are based on a quasi-Proportional-To-Absolute-Temperature (PTAT) curve.

6 Claims, 7 Drawing Sheets

ND TUNED
AUTOMATIC GAIN CONTROL AND TUNED LOW NOISE AMPLIFIER FOR PROCESS-INDEPENDENT GAIN SYSTEMS

CROSS-REFERENCE TO RELATED APPLICATIONS

This application claims the benefit under 35 U.S.C. Section 119(e) of and commonly-assigned U.S. provisional patent application Ser. No. 60/627,595, filed Nov. 12, 2004, entitled "RF CHIP FOR GLOBAL POSITIONING SYSTEM RECEIVER," by Lloyd Jian-Le Jiang et al., which application is incorporated by reference herein.

BACKGROUND OF THE INVENTION

1. Field of the Invention

The present invention relates generally to Global Positioning System (GPS) receivers, and in particular, to a gain and transconductor control for circuits used in GPS receivers.

2. Description of the Related Art

The use of GPS in consumer products has become commonplace. Hand-held devices used for mountaineering, automobile navigation systems, and GPS for use with cellular telephones are just a few examples of consumer products using GPS technology.

However, GPS receiver integrated circuit (IC) chips are, typically, very sensitive to process variations from one edge of a wafer to another. This variation from chip to chip across a chip lot requires that each IC chip be tested and characterized, and, possibly, only used in specific applications because the operational parameters of a given GPS receiver IC do not meet the tolerances of certain applications.

As GPS technology is being combined with these devices, the GPS chips need to be more uniform, because the GPS chips are being used in record numbers.

It can be seen, then, that there is a need in the art to make GPS chips more uniform in terms of performance and response. It can also be seen, then, that there is a need in the art to reduce the manufacturing variations across a wafer.

SUMMARY OF THE INVENTION

To minimize the limitations in the prior art, and to minimize other limitations that will become apparent upon reading and understanding the present specification, the present invention describes a tuned low-noise amplifier. A device in accordance with the present invention comprises a first current source, a second current source, a comparator, coupled to the first current source and the second current source, for providing a control signal, and a third current source, receiving the control signal and coupled to the tuned low-noise amplifier, wherein a current in the third current source is proportional to a current in the first current source and the second current source, where values of the first current source, the second current source, and the third current source are based on a quasi-Proportional-To-Absolute-Temperature (PTAT) curve.

Such a device further optionally includes the first current source and second current source, being transistors. wherein the first current source and the second current source are designed with similar scaling characteristics, the third current source being a transistor with a scaling characteristic different than the scaling characteristics of the first current source and the second current source, and the tuned low noise amplifier being used in a Global Positioning System (GPS) receiver.

The present invention also discloses a constant transconductance bias block. Such a device comprises a first transistor for receiving a first common mode voltage input, a second transistor for receiving a second common mode voltage input, a summing block, coupled to the first transistor and the second transistor, for receiving a reference current, and a third transistor, coupled to the first transistor and the second transistor, and receiving a control signal from the summing block, for controlling the current through the first transistor and the second transistor based on the reference current.

Such a device can also optionally be used in a GPS receiver.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

In a conventional tuned Low Noise Amplifier (LNA) with an on-chip inductor load, the gain variation at different locations on the wafer is usually worse than a regular amplifier with resistor or current source load. In addition to transistor and resistor parameter variations, the inductor parameters also vary widely at different temperature and process corners for a given wafer. These variations not only change the peak amplitude of the gain curve but also shift its center frequency.

Figure 1:
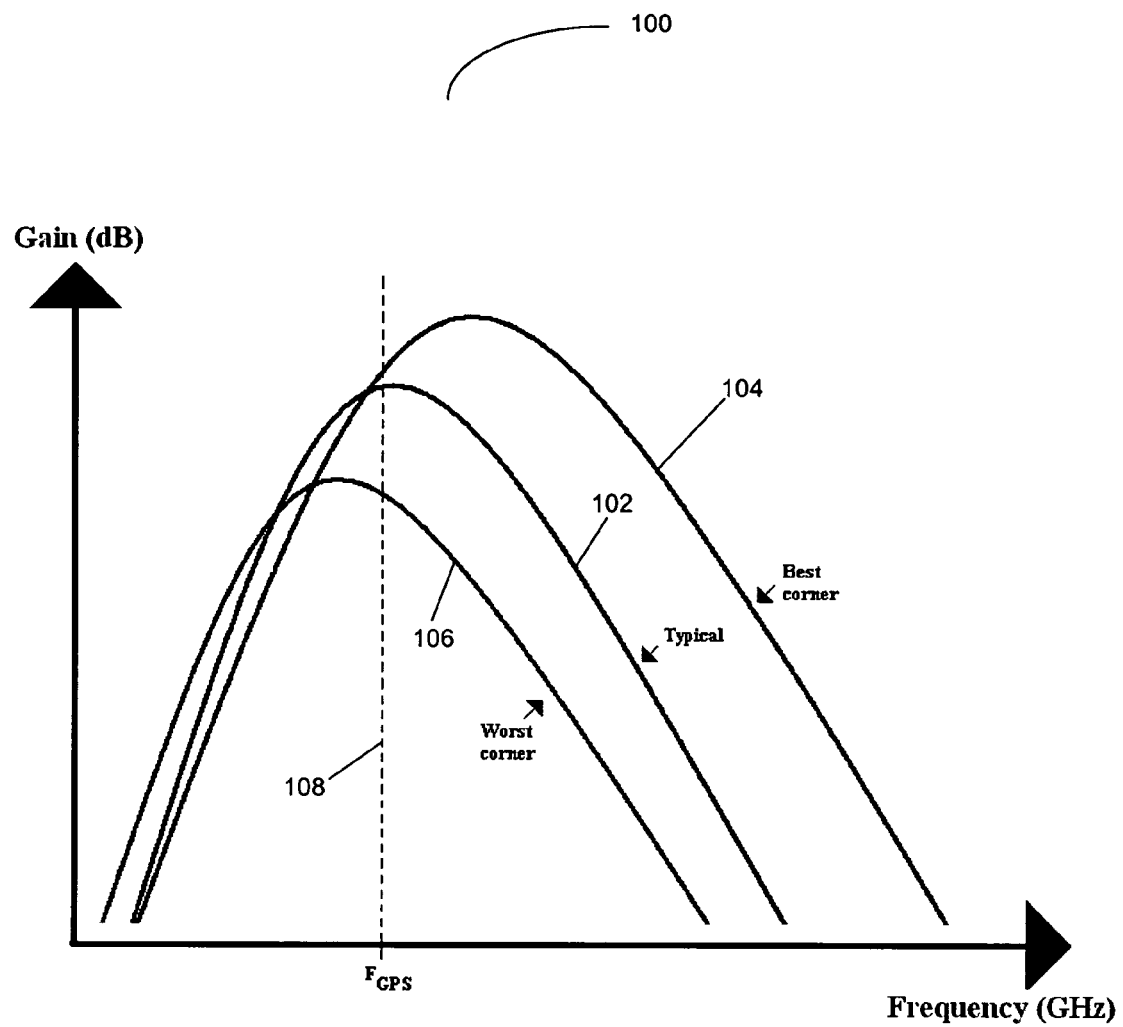
FIG. 1 illustrates typical changes of gain and frequency response on a wafer due to processing variations.

FIG. 1 illustrates typical changes of gain and frequency response on a wafer due to processing variations.

Graph 100 shows the variation in gain and frequency for typical chips 102, the best corner 104 chips, and worst corner 106 chips from a given wafer. Desired frequency 108 is also shown. As a result of the differences between best corner 104 chips and worst corner 106 chips, the gain and the frequency response of each chip on a given wafer must be characterized, or the resultant system using such chips may have errors that are not correctable using other methods.

Further, the gain variation at the operating frequency $F_{GPS}$ 108 can be large, which deteriorates circuit yields for such chips.

The present invention uses a modified Proportional To Absolute Temperature (PTAT) bias scheme to minimize the gain deviation between the two extreme corners, and therefore enhances the yield of such chips made using the electronics of the present invention.

A single stage bipolar amplifier (gain=$g_m R_L$) is usually designed with a PTAT bias current in order to minimize gain variation as temperature changes. The transconductance ($g_m$) of a bipolar transistor is $g_m = I_c/V_T$, where $I_c$ is the bias current, $V_T$ is the thermal voltage ($V_T = kT/q$) which is proportional to absolute temperature T. If $I_c$ is PTAT, then $g_m$ will not vary with temperature, therefore one major factor of gain variation is eliminated.

Figure 2:
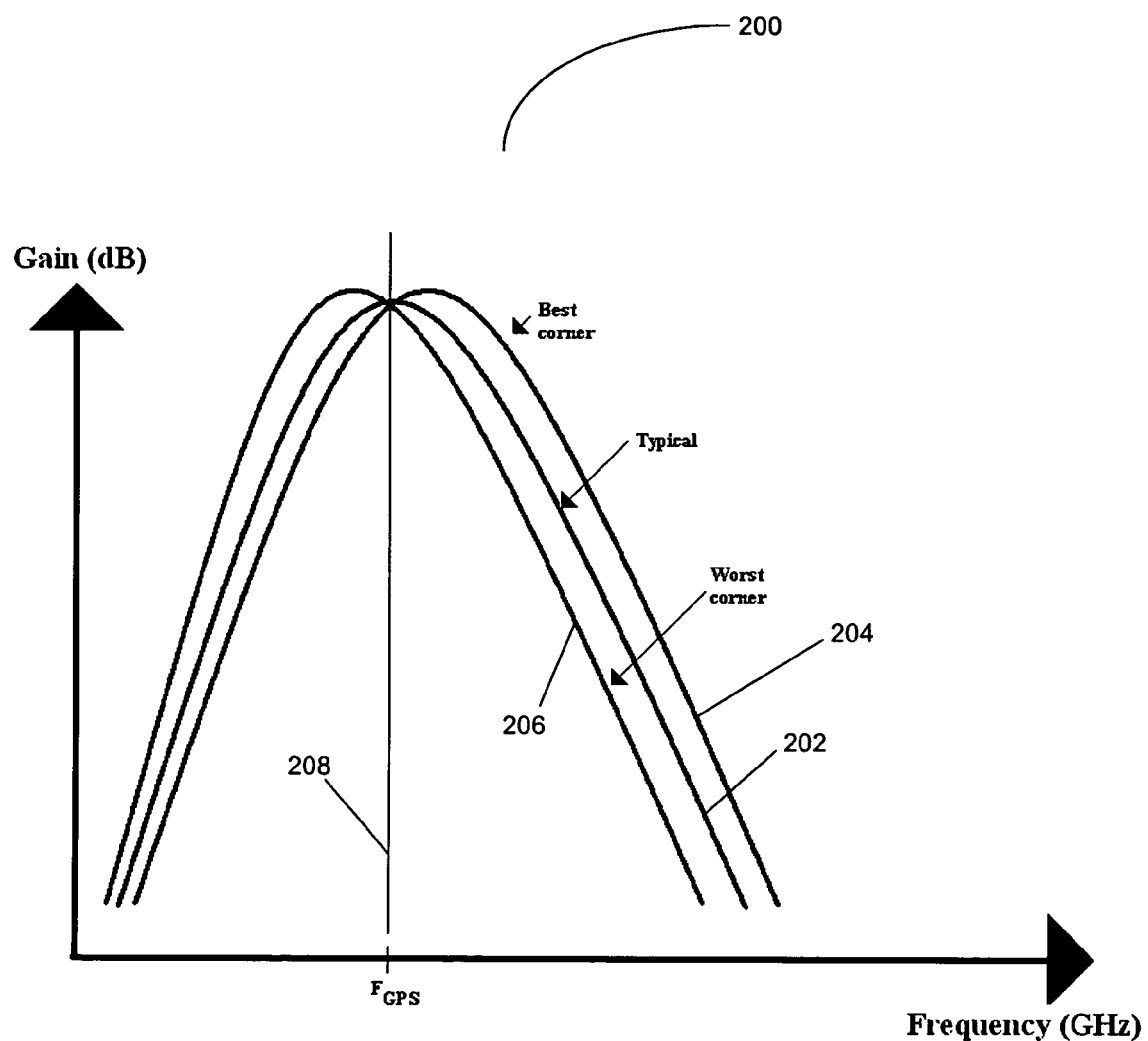
FIG. 2 illustrates the changes in gain and frequency response on a wafer made using the present invention.

FIG. 2 illustrates the changes in gain and frequency response on a wafer made using the present invention.

Graph 200 shows the variation in gain and frequency for typical chips 202, the best corner 204 chips, and worst corner 206 chips from a given wafer using the present invention. Desired frequency 208 is also shown. Now, with the present invention, the differences between best corner 204 chips and worst corner 206 chips is much smaller than in the related art, and the gain and the frequency response of each chip on a given wafer has a smaller variation. Thus, any circuit that the chips are used in will have smaller errors, or, depending on the circuit design, no errors at all, and the yield for such chips is much higher than in the related art.

Modern LNA's are manufactured mostly using a CMOS process, where the relation $g_m = I_c/V_T$ does not apply; meanwhile, as previously discussed herein, on-chip parameter variations, most specifically for inductors, make a significant contribution to a wider gain variation. To help alleviate these effects, the present invention devises a new design procedure.

First, the LNA is designed under typical conditions, including a nominal bias current, and then the bias current is varied at the best and worst corners in order to find two values of bias current which will minimize the gain range at $F_{GPS}$ as shown in FIG. 2. Then, these three bias current values are interpolated to find a best fit straight line. The slope of this line will be different from a standard PTAT slope, hence the name quasi-PTAT bias.

Figure 3:
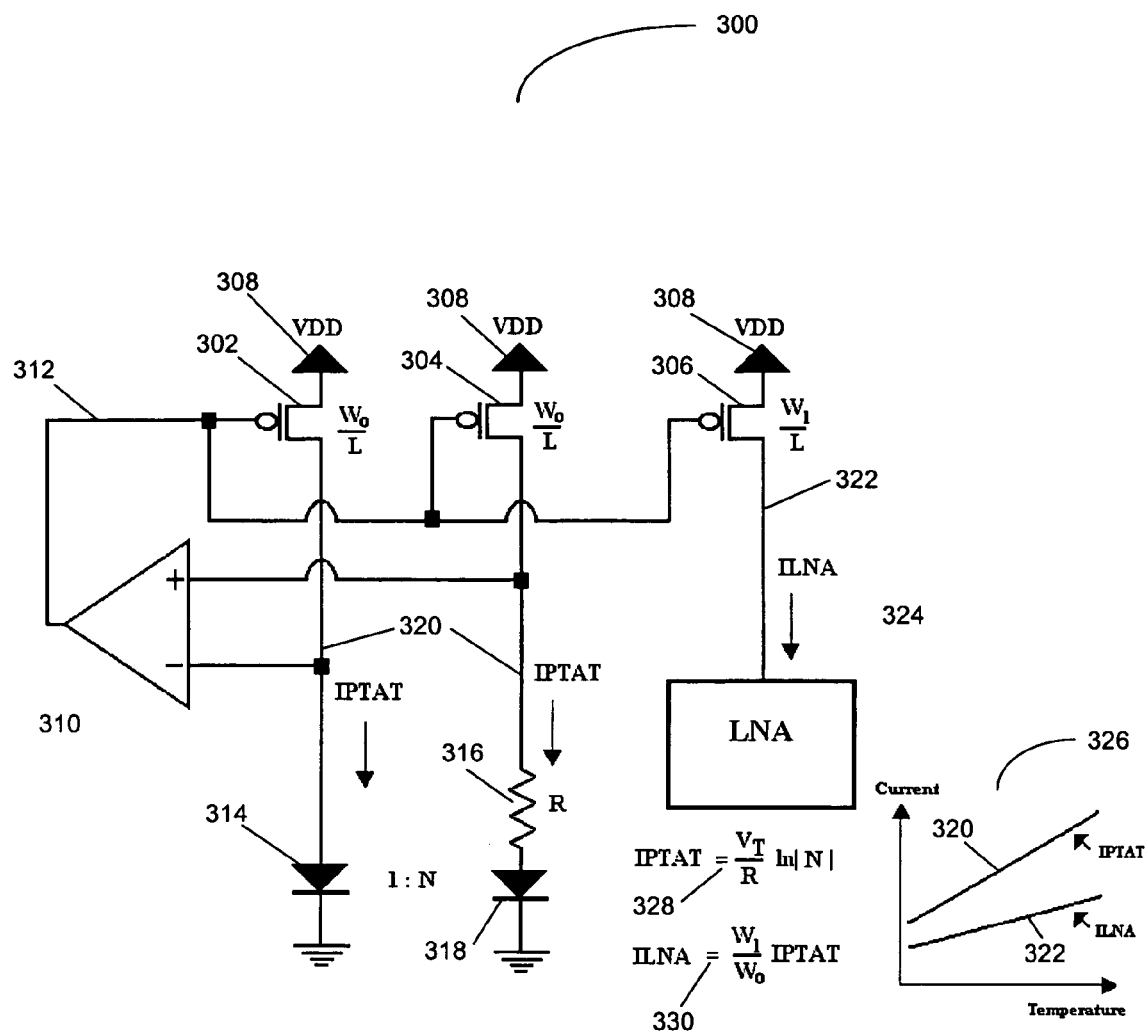
FIG. 3 illustrates a circuit that employs the present invention.

FIG. 3 illustrates a circuit that employs the present invention.

Circuit 300 shows the amplifier 310 output 312 controlling transistors 302, 304, and 306. The inputs of amplifier 310 are coupled to the drains of two equally sized transistors 302 and 304, forcing the same voltage drop over the diode connected transistor pnp 314 and the voltage drop of the series combination of resistor 316 and diode connected transistor pnp 318, generating a current that is proportional to absolute temperature; called PTAT, through transistors 302 and 304, as described by equation 328 and plotted in 326 against temperature labeled 320. The current of transistor 306 is a scaled version of the current through 302 and 304 by the ratio of their sizes as given by equation 330, and its curve is plotted in 326 and shown as 322, and is referred as quasi-PTAT current or ILNA. This current with the desired slope is delivered to the LNA 324.

Biquad Filter AGC

Other circuit devices are somewhat process independent. For example, filter gain and Automatic Gain Control (AGC) functions are constant, independent of where each individual IC chip was in relation to the wafer process corners. However, combining the filtering and AGC functions as in the present invention saves IC chip area while minimizing power dissipation. The biquad filter architecture of the present invention also prevents the filter from hard clipping due to large interfering signals, such as intentional jamming signals.

Gain and filter corner settings are dependent on the ratios of semiconductor devices such as resistors, capacitors, and transconductors. Resistor and capacitor ratio based designs can consume large areas or high currents. Transconductor ratioed designs allow for smaller areas and lower power dissipation at the expense of input voltage swing.

The transconductor value can change if the voltage swing becomes too large, or if the common mode of the small signal shifts. The design of the present invention uses the input common mode to set the current through the transconductor cell. Then the transconductance, or "$g_m$" is set as:

$$g_m = \frac{I_{ref}}{(V_{CM} + \Delta V) - (V_{CM} - \Delta V)} = \frac{I_{ref}}{2\Delta V}$$

Where $I_{ref}$ and $\Delta V$ are bandgap based constant values. The transconductance, $g_m$, can be changed by changing $I_{ref}$ while keeping $\Delta V$ constant.

Figure 4:
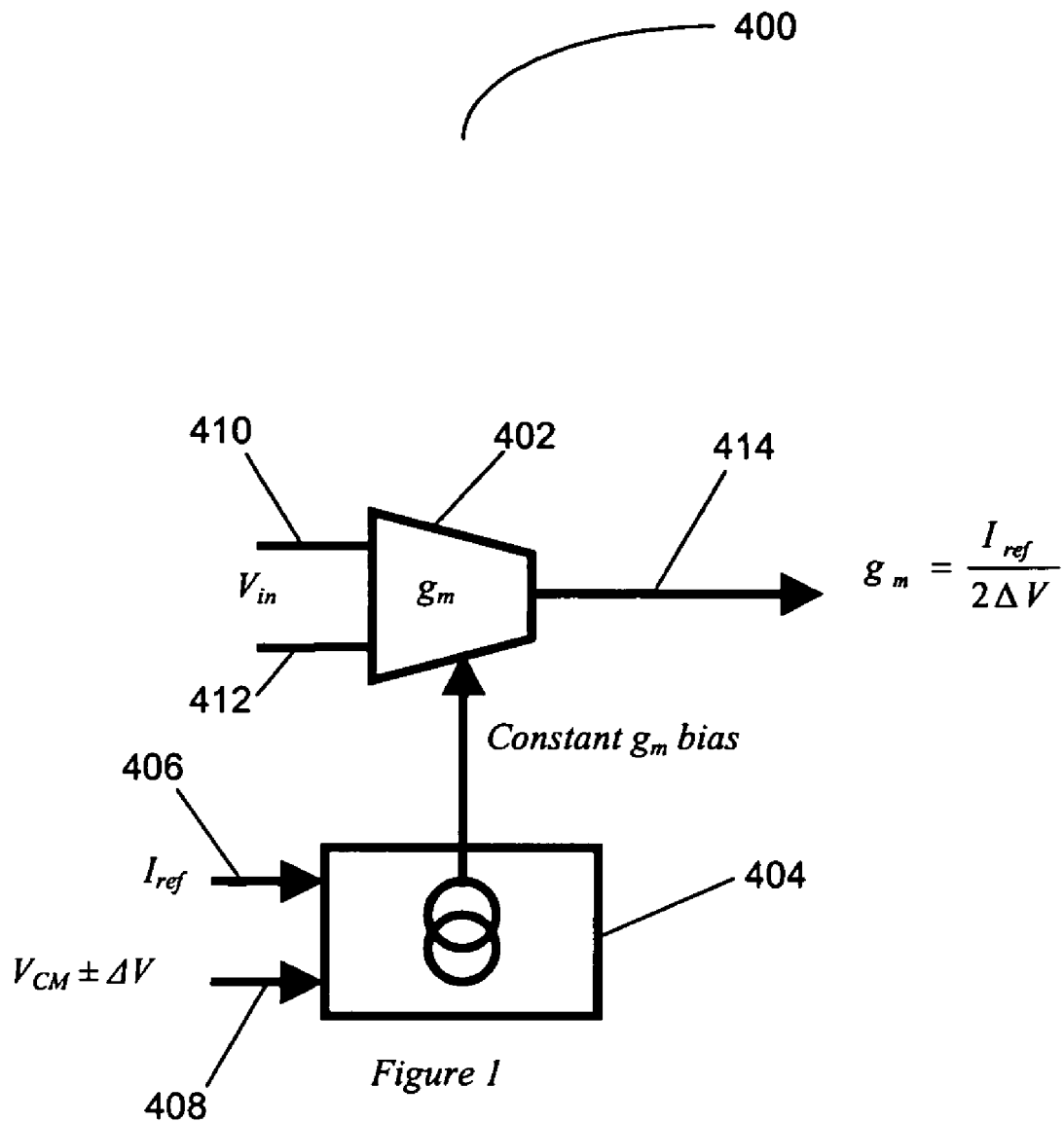
FIG. 4 illustrates a constant gin biasing of the present invention.

FIG. 4 illustrates a constant gm biasing of the present invention.

Circuit 400 with transconductor cell 402, and bias 404 are shown. The bias device has inputs 406, a current reference, and 408, two voltage references centered around a common mode voltage, shown in FIG. 5 as signals 408A and 408B. The input voltage is input to transconductance cell 402 on lines 410 and 412, and the output of transconductance cell 402 is output 414.

As described above, bias 404 allows a variation in Iref 406, alone, to control the transconducatance of the transconductor 402. This allows for very accurate tuning of the transconductor value independent of process, voltage or temperature variations.

Figure 5:
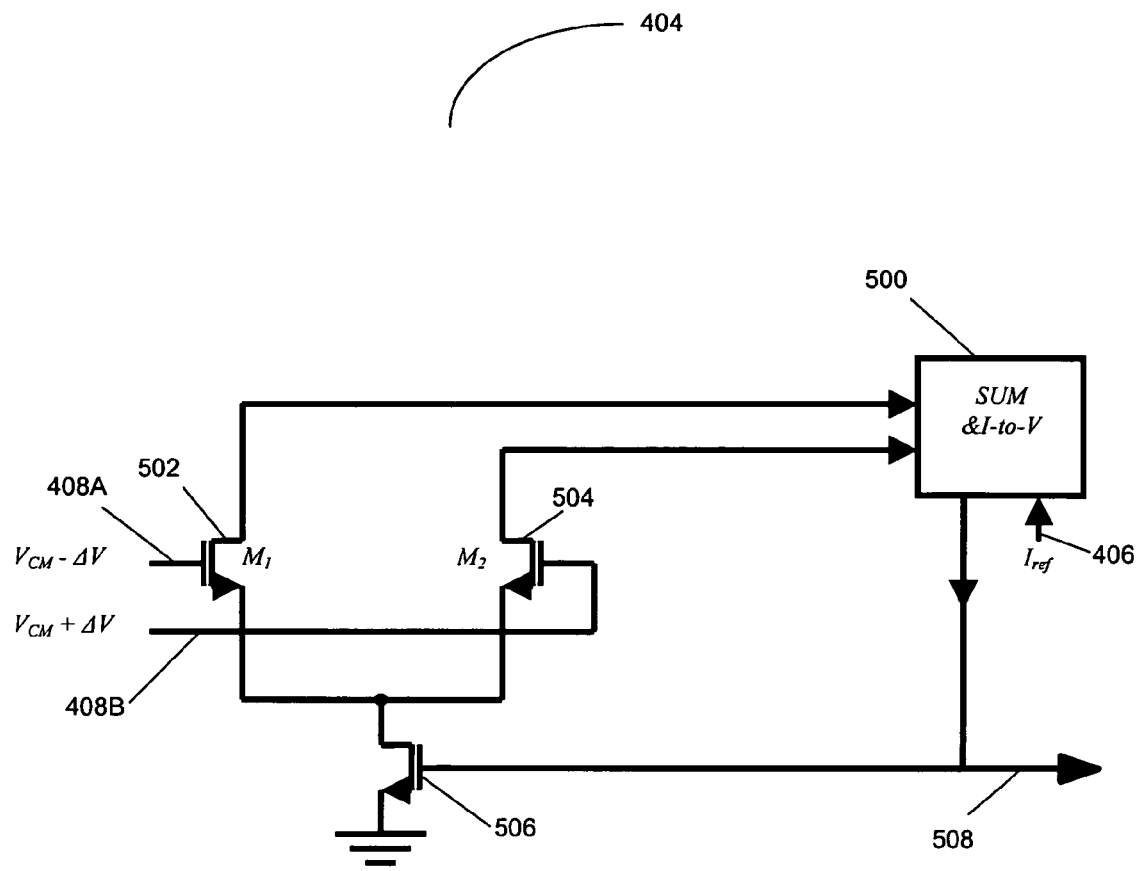
FIG. 5 illustrates an embodiment of the bias block in accordance with the present invention.

FIG. 5 illustrates one embodiment of the bias block in accordance with the present invention. It is understood that other embodiments may be utilized and structural changes may be made without departing from the scope of the present invention.

Bias 404 is shown, with Iref 406 as an input to a summing block and current-to-voltage converter 500, while signal 408 is shown as two signals, common mode minus the offset voltage 408A and common mode plus the offset voltage 408B. Signal 408A is input to the control input of transistor 502, and signal 408B is input to the control input of transistor 504. Summing block 500 uses Iref 406, sums it with the current outputs of transistors 502 and 504, and generates the voltage control signal 508 for transistor 506. Output 508 is also the constant gm bias shown in FIG. 4. Signals 406, 408A, and 408B are generated form a constant Bandgap reference such that the ratio of 406 to (408A-408B) is a constant.

Although all transistors shown in FIG. 5 are MOS transistors, all or some of them can be replaced with other devices such as bipolar junction transistors.

Figure 6:
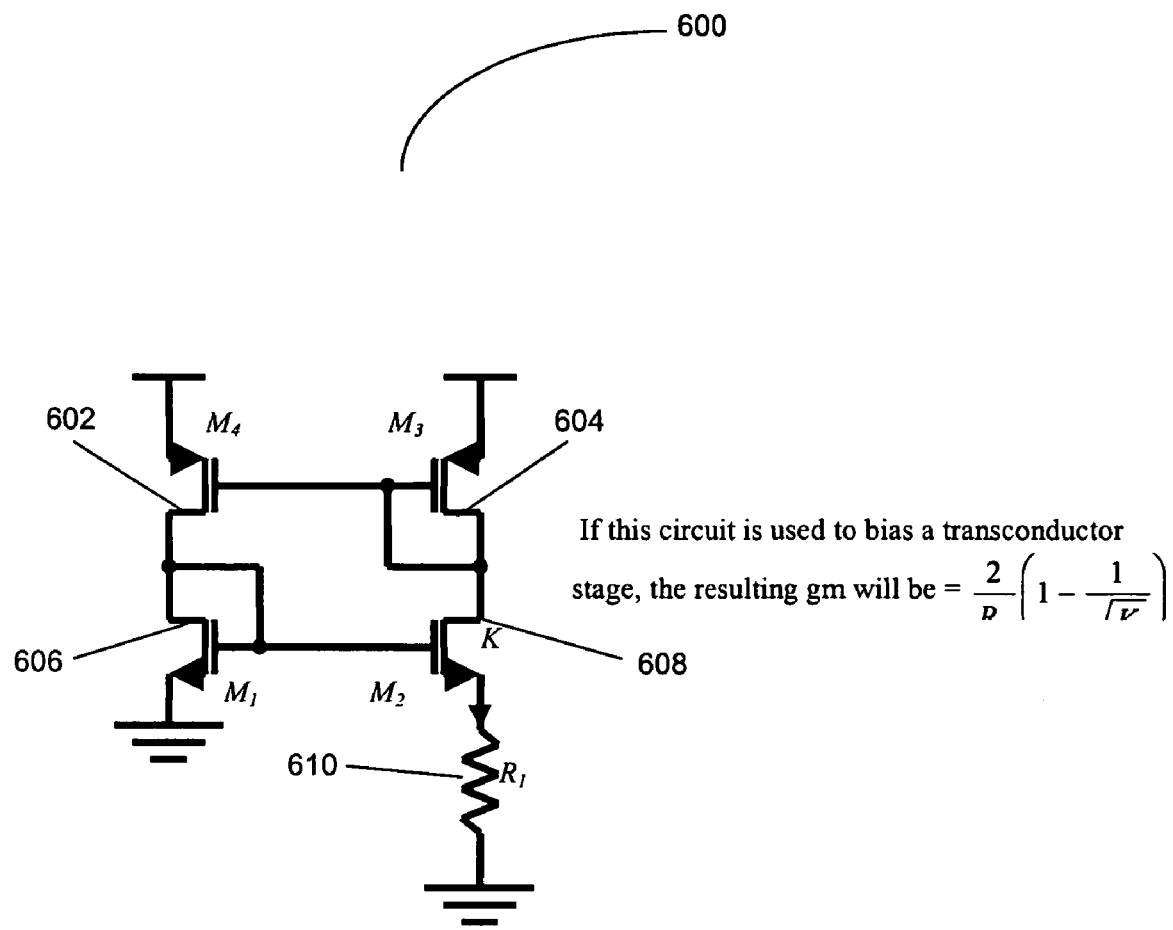
FIG. 6 illustrates a gm bias circuit of the related art.

FIG. 6 illustrates a gm bias circuit of the related art.

Circuit 600 shows transistors 602-608, along with resistor 610. Circuit 600 fixes a gm based on a ratio of the sizes of transistors 602-608, which assumes a very good match between transistor 608 and an external resistor 610, which is typically very difficult to achieve in practice. As such, any bias generated by such a circuit 600 is not an accurate linear control for any transconductance circuit.

Figure 7:
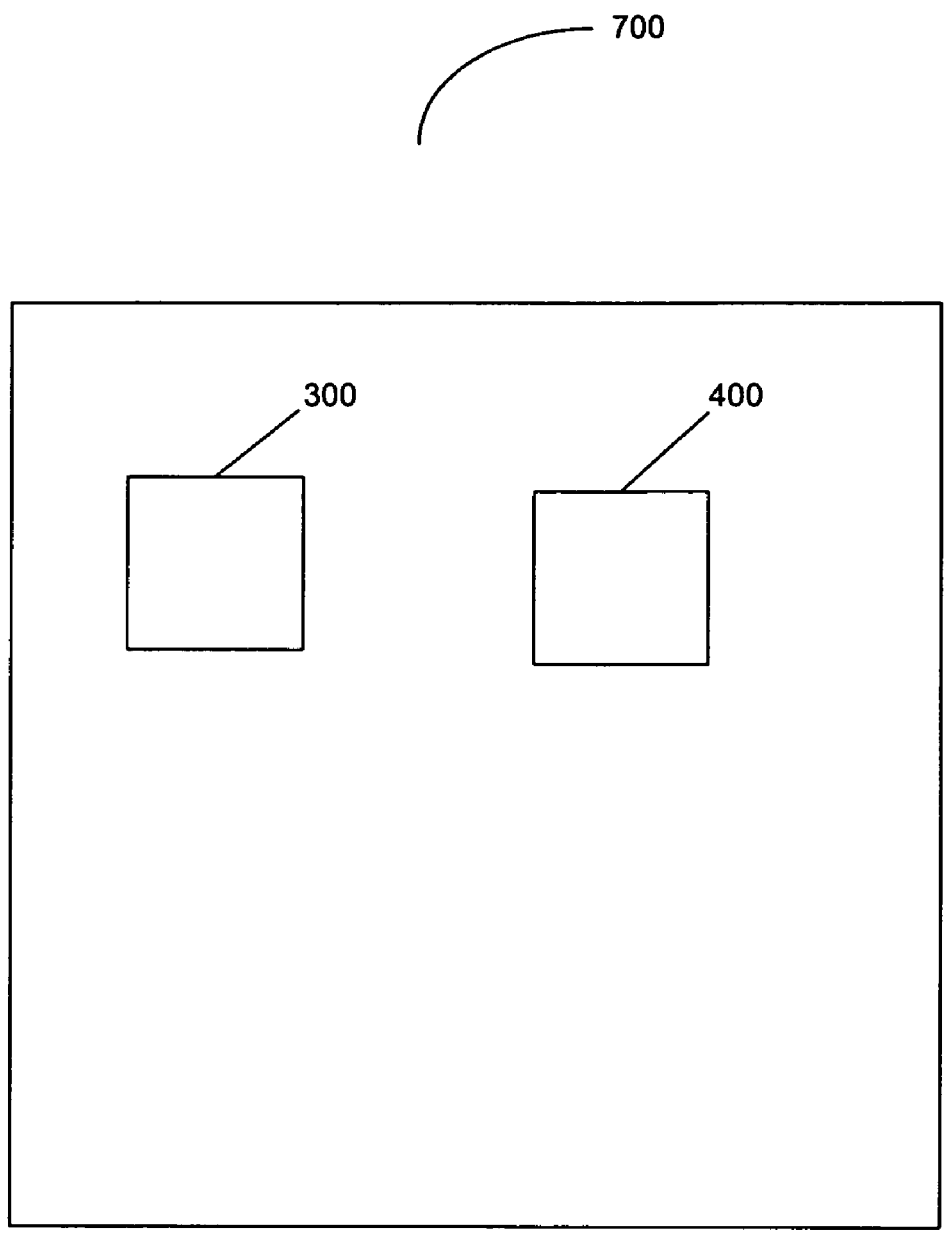
FIG. 7 illustrates a GPS receiver comprising the circuitry of the present invention.

FIG. 7 illustrates a GPS receiver comprising the circuitry of the present invention.

GPS receiver 700 is shown, and circuits 300 and 400 are shown as part of the GPS receiver 700. A GPS receiver in accordance with the present invention can have either circuit 300, circuit 400, or both circuit 300 and circuit 400, present, depending on the design and applications that GPS receiver 700 will be designed for and operated in.

CONCLUSION

In summary, the present invention describes a tuned low-noise amplifier. A device in accordance with the present invention comprises a first current source, a second current source, a comparator, coupled to the first current source and the second current source, for providing a control signal, and a third current source, receiving the control signal and coupled to the tuned low-noise amplifier, wherein a current in the third current source is proportional to a current in the first current source and the second current source, where values of the first current source, the second current source, and the third current source are based on a quasi-Proportional-To-Absolute-Temperature (PTAT) curve.

Such a device further optionally includes the first current source and second current source, being transistors. wherein the first current source and the second current source are designed with similar scaling characteristics, the third current source being a transistor with a scaling characteristic different than the scaling characteristics of the first current source and the second current source, and the tuned low noise amplifier being used in a Global Positioning System (GPS) receiver.

The present invention also discloses a constant transconductance bias block. Such a device comprises a first transistor for receiving a first common mode voltage input, a second transistor for receiving a second common mode voltage input, a summing block, coupled to the first transistor and the second transistor, for receiving a reference current, and a third transistor, coupled to the first transistor and the second transistor, and receiving a control signal from the summing block, for controlling the current through the first transistor and the second transistor based on the reference current.

Such a device can also optionally be used in a GPS receiver.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto and the equivalents thereof.

What is claimed is:

1. A tuned low-noise amplifier for use in a GPS receiver, comprising:
   a first current source;
   a second current source;
   a comparator, coupled to the first current source and the second current source, for providing a control signal; and
   a third current source, receiving the control signal and coupled to the tuned low-noise amplifier, wherein a current in the third current source is proportional to a current in the first current source and the second current source, where values of the first current source, the second current source, and the third current source are based on a quasi-Proportional-To-Absolute-Temperature (PTAT) curve.

2. The tuned low-noise amplifier of claim 1, wherein the first current source is a transistor.

3. The tuned low-noise amplifier of claim 1, wherein the second current source is a transistor.

4. The tuned low-noise amplifier of claim 3, wherein the first current source and the second current source are designed with similar scaling characteristics.

5. The tuned low-noise amplifier of claim 4, wherein the third current source is a transistor with a scaling characteristic different than the scaling characteristics of the first current source and the second current source.

6. The tuned low noise amplifier of claim 5, wherein the tuned low noise amplifier is used in a Global Positioning System (GPS) receiver.

* * * * *